United States Patent [19]

Kurihara et al.

[11] Patent Number: 4,513,256
[45] Date of Patent: Apr. 23, 1985

[54] SWEPT FREQUENCY SIGNAL GENERATOR

[75] Inventors: Takenori Kurihara, Gyoda; Shigeki Tojo, Musashino; Yohei Hirakoso, Gyoda, all of Japan

[73] Assignee: Takeda Riken Co., Ltd., Tokyo, Japan

[21] Appl. No.: 508,933

[22] Filed: Jun. 29, 1983

[30] Foreign Application Priority Data

Jul. 5, 1982 [JP] Japan .................................. 57-117328

[51] Int. Cl.³ ........................ H03B 23/00; H03L 7/12
[52] U.S. Cl. ...................................... 331/4; 328/185; 328/189; 331/178
[58] Field of Search ............... 331/4, 178; 324/77 CS; 328/181, 185, 189

[56] References Cited

U.S. PATENT DOCUMENTS 4,130,808 12/1978 Marzalek ............................. 331/4 X
4,349,789 9/1982 Kurihara ................................. 331/4
4,468,638 8/1984 Kyriakos ............................ 331/4 X Primary Examiner—Siegfried H. Grimm
Attorney, Agent, or Firm—Staas & Halsey

[57] ABSTRACT

A sweep voltage from a sweep voltage generator is provided to sweep start and stop adjusting means, the outputs of which are summed by a summing circuit and, by the summed output, the oscillation frequency of a voltage controller oscillator is controlled. The oscillation frequency of the voltage controlled oscillator and the output frequency of a reference signal generator set to a sweep start frequency are compared by comparing means. The output of the sweep voltage generator is put in a sweep start state and sweep start adjusting means is adjusted in accordance with the output of the comparing means, thereby to cause the oscillation frequency of the voltage controlled oscillator to agree with a set sweep start frequency. The output of the sweep voltage generator is put in a sweep stop state and sweep stop adjusting means is adjusted in accordance with the output of the comparing means, thereby to cause the oscillation frequency of the voltage controlled oscillator to agree with a set sweep stop frequency.

11 Claims, 14 Drawing Figures

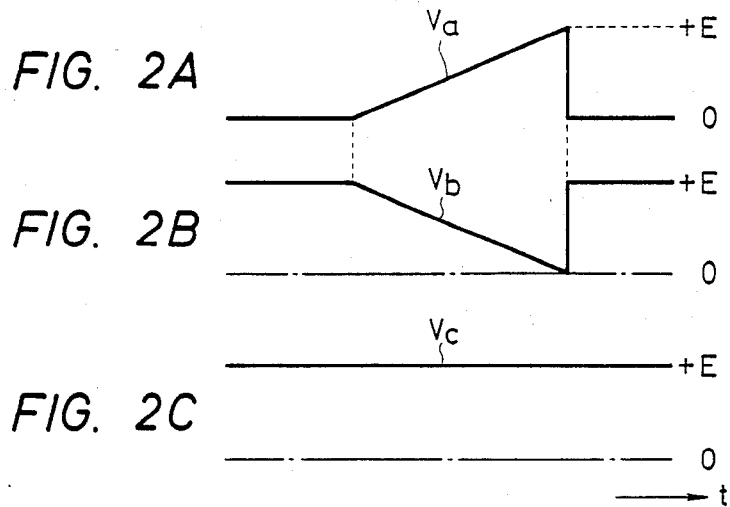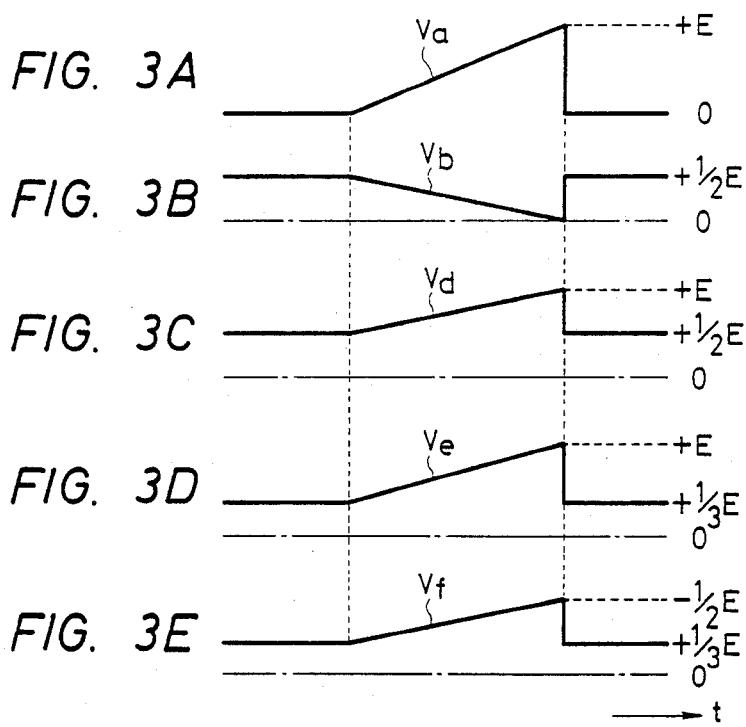

SWEPT FREQUENCY SIGNAL GENERATOR

BACKGROUND OF THE INVENTION

The present invention relates to a swept frequency signal generator which is employed as a swept frequency local oscillator, for instance, in a spectrum analyzer and the oscillation frequency of which is swept by a sweep voltage.

For example, in a spectrum analyzer, a sweep voltage is generated and provided to a voltage controlled oscillator (hereinafter referred to as the VCO) to sweep its oscillation frequency and the swept frequency signal is used as a local signal for receiving an input signal for displaying on the screen of a cathode ray tube its frequency component or the frequency characteristic or the like of a circuit to be measured.

It is required that the oscillation frequency of the VCO accurately sweep a preset frequency range. To meet this requirement, it has been proposed to compare sweep start and stop voltages of the sweep voltage from a sweep voltage generator with set values and to control the sweep start and stop voltages to agree with the set values.

Even if the sweep voltage is accurately defined, however, it is unwarranted to expect that the oscillation frequency of the VCO which is controlled by the sweep voltage sweeps a predetermined frequency range. That is to say, in the VCO using a YIG, since a magnetic circuit is controlled, the frequency sweep characteristic has a hysteresis and nonlinearlity owing to the magnetic circuit, resulting in the defect of low setting accuracy of the sweep start and stop frequencies.

A solution to the abovesaid defect has been proposed in U.S. Pat. No. 4,130,808 issued Dec. 19, 1978 and entitled "Phase Lock Stabilized Swept Frequency Signal Source". According to this U.S. patent, prior to the start of each sweep, the VCO output and the output of a high stability reference oscillator are phase compared by a phase comparator and the phase compared output is held in a sample hold circuit and, at the same time, the held output is supplied as a control signal to the VCO via a summing circuit to establish a phase locked loop, causing the oscillation frequency of the VCO to agree with the oscillation frequency of the reference oscillator. Then the output of the phase comparator is cut off and the outputs of the sample hold circuit and the sweep voltage generator are summed by the summing circuit, the output of which is provided to the VCO to control it. In this way, the sweep start frequency is made to accurately coincide with the oscillation frequency of the reference oscillator. With this conventional technique, however, it is unwarranted to expect that the sweep stop frequency accurately agrees with a desired frequency and it is likely to deviate therefrom.

SUMMARY OF THE INVENTION

It is therefore an object of the present invention to provide a swept frequency signal generator which permits a frequency sweep with not only the sweep start frequency but also the sweep stop frequency held accurately in agreement with preset values.

Another object of the present invention is to provide a swept frequency signal generator which permits accurate agreement of each of the sweep start and stop frequencies with a set value and allows the generation of a marker accurately at a set frequency in the course of the sweep.

Yet another object of the present invention is to provide a swept frequency signal generator which is able to make the sweep start and stop frequencies accurately agree with respective set values and to prevent the influence of drifts during the repetitive sweep operation.

According to the present invention, the output sweep voltage of the sweep voltage generator is supplied to sweep start adjusting means and sweep stop adjusting means, wherein the amplitude of the output sweep voltage is adjusted to a set value and the amplitude adjusted sweep voltages are summed together by a summing circuit, the output of which is provided as control signal to the VCO. In this case, the sweep voltage is reversed in polarity by converting means without changing its sweep range and then is fed to the sweep stop adjusting means. On the other hand, a high stability reference signal generator is provided which creates a reference signal of a set frequency. Sweep start and stop frequencies can be input into a controller for setting and the controller sets the sweep start frequency in the reference signal generator to produce a reference signal of the sweep start frequency and holds the sweep voltage generator at a voltage for starting the sweep. The reference signal and the VCO output are compared by phase comparing means and the comparison result is checked by the controller and, in accordance with the comparison result, the controller controls the setting of the sweep start adjusting means to bring the output frequency of the VCO into agreement with the set sweep start frequency. At the same time, the controller holds the sweep voltage generator at a voltage for stopping the sweep and sets the reference signal frequency of the reference signal generator to the input sweep stop frequency and, in accordance with the comparison result by the phase comparing means at that time, the controller controls the setting of the sweep stop adjusting means to make the oscillation frequency of the VCO agree with the set sweep stop frequency. After such adjustment and control a sweep voltage is repeatedly generated from the sweep voltage generator.

A marker frequency is input into the controller for setting in the reference signal generator. When the oscillation frequency of the VCO becomes equal to the marker frequency during sweeping, it is detected by the phase comparing means and a marker signal is produced. An intermediate frequency in the sweep frequency range of the VCO is set in the reference signal generator and when the oscillation frequency of the VCO approaches the set frequency, the output of the phase comparing means is fed back to the VCO via a sample hold circuit to establish a phase lock loop circuit, thereby to correct drifts of the VCO. Then the phase lock loop circuit is opened and the outputs of the sample hold circuit and the summing circuit are added and fed to the VCO.

BRIEF DESCRIPTION OF THE DRAWINGS

FIGS. 2A through 2C are diagrams showing a sweep voltage, its inverted sweep voltage and the combination thereof, respectively;

FIGS. 3A through 3E are diagrams showing various sweep voltages with different sweep start and stop voltages;

DESCRIPTION OF THE PREFERRED EMBODIMENTS

Figure 1:
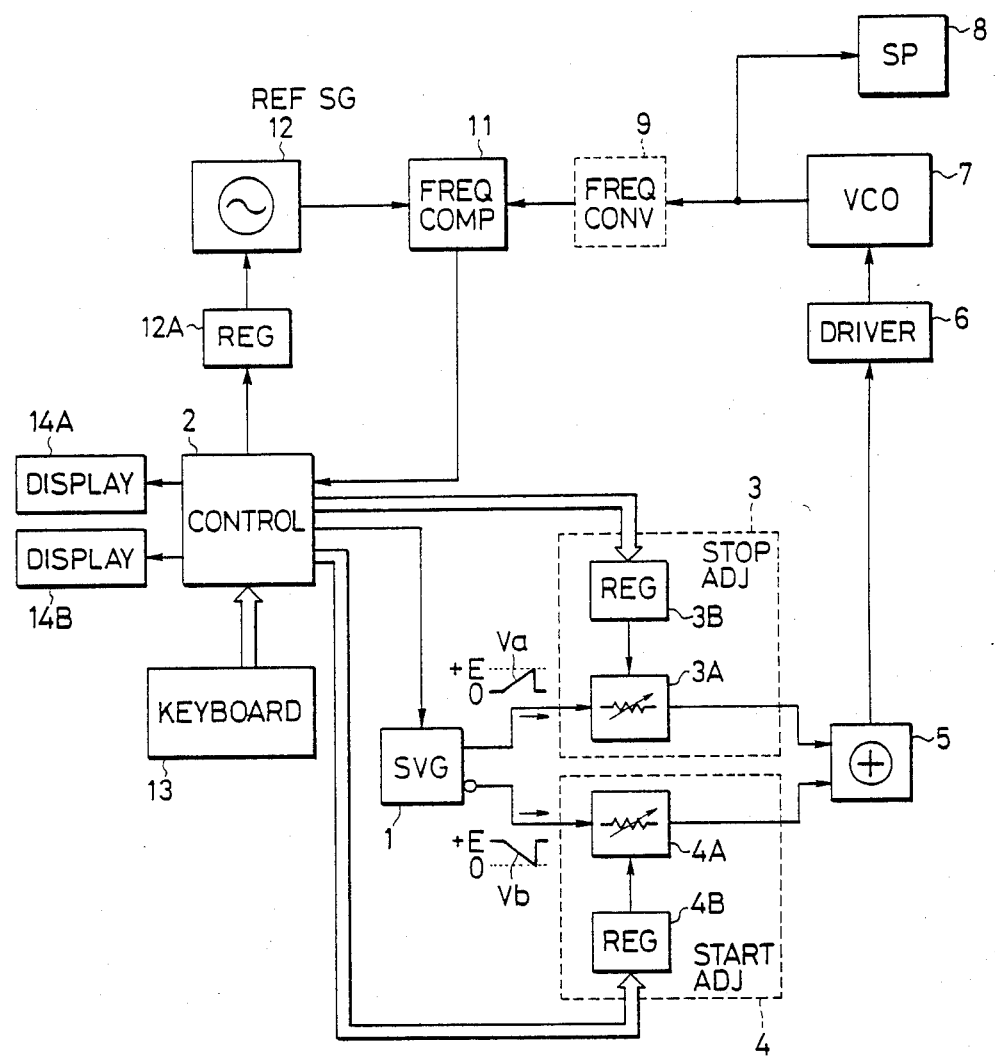
FIG. 1 is a block diagram illustrating an embodiment of the swept frequency signal generator of the present invention.

A sweep voltage generator 1 is controlled by a controller 2 to start and stop the sweep. The controller 2 is formed, for example, by a microcomputer. The sweep voltage generator 1 produces sweep voltages Va and Vb which undergo variations in opposite directions over the same voltage range, and the sweep voltages Va and Vb are applied to sweep stop adjusting means 3 and sweep start adjusting means 4, respectively. The adjusting means 3 and 4 can be respectively formed, for instance, by variable attenuators 3A and 4A and registers 3B and 4B. The amplitudes of the sweep voltages Va and Vb from the sweep voltage generator 1 are adjusted by the variable attenuators 3A and 4A and the amplitude adjusted sweep voltages are provided to an adder 5. The adder 5 provides a sweep voltage which has a sweep start voltage and a sweep stop voltage of values corresponding to values set by the sweep stop and start adjusting means 3 and 4. This will be described later in greater detail.

The output of the adder 5 is connected via a VCO driver 6 to a VCO 7 to supply it with the sweep voltage. The oscillation of the VCO 7 is frequency swept within a range corresponding to the voltage range set by the sweep stop and start adjusting means 3 and 4. The VCO 7 may be of an ordinary electronic circuit type or a sweep oscillator using a YIG.

The oscillation signal of the VCO 7 is supplied to an apparatus 8 such as, for example, a spectrum analyzer and used as a swept frequency signal and, at the same time, it is provided to a frequency comparing means 11. The frequency comparing means 11 compares the oscillation frequency of the VCO 7 with the frequency of a reference signal which is provided from a high precision, high stability reference signal generator 12 such as, for example, a synthesizer and the comparison result is provided to the controller 2. The controller 2 sets a frequency in a register 12A and a reference signal of the set frequency is produced by the reference signal generator 12. As the reference signal generator 12, use can be made of, for instance, the digital phase-locked synthesizer described in Vodim Manasremitsh, "Frequency Synthesis Theory and Design", John Wiley, 1980, pp 31–39. From a keyboard 13 sweep start and stop frequencies $f_1$ and $f_2$ of the VCO 7 and a marker frequency are input to the controller 2 and, further, such an arrangement is made that a control signal for switching between an initialization mode and a repetitive sweep mode can be input to the controller 2. Displays 14A and 14B respectively provide indications of the sweep start and stop frequencies $f_1$ and $f_2$ thus input.

A description will be given of the adjusting means 3 and 4. Let it be assumed that the sweep voltage generator 1 derives at its positive-phase output terminal such a sweep voltage Va as shown in FIG. 2A which sweeps from a zero voltage to a voltage E, and that the sweep width, for instance, 0 to +E, of the sweep voltage Va covers the voltage range in which the overall sweepable range of the VCO 7 can be controlled. Accordingly, if the attenuation of the sweep stop adjusting means 3 is 0 and the attenuation of the sweep start adjusting means 4 is infinite, then the sweep voltage Va of the sweep oscillator 1 is input without change into the adder 5 and provided via the VCO driver 6 to the VCO 7. In consequence, the oscillation frequency of the VCO 7 is swept over the overall sweepable range at this time.

The sweep voltage generator 1 derives at its antiphase output terminal such a sweep voltage Vb as shown in FIG. 2B which is opposite in phase to the sweep voltage Va. The sweep voltage Vb is a sweep voltage signal which voltage sweeps from the voltage +E to the zero voltage. Accordingly, when the attenuation of each of the adjusting means 3 and 4 is set to zero, the adder 5 produces a DC voltage Vc which has a voltage value +E as shown in FIG. 2C.

Assuming that the attenuation of the sweep stop adjusting means 3 is set to zero and that the attenuation of the sweep start adjusting means 4 is set to ½, the adjusting means 3 and 4 yield the positive-phase sweep voltage Va and a voltage one-half of the antiphase sweep voltage Vb as shown in FIGS. 3A and 3B, respectively. Consequently, the adder 5 provides such a sweep voltage Vd as shown in FIG. 3C which starts the sweep with a voltage +E/2 and stops the sweep with the voltage +E.

In the case where the setting condition of the sweep stop adjusting means 3 is held unchanged but only the attenuation of the sweep start adjusting means 4 is set to ⅓, such a sweep voltage Ve as shown in FIG. 3D is obtained which starts the sweep with a voltage +E/3 and stops the sweep with the voltage +E.

In this way, by changing the attenuation of the sweep start adjusting means 4, the sweep start voltage can be set to a desired value within the range of 0 to +E.

On the other hand, when the attenuation of the sweep start adjusting means 4 is held at ⅓ but the attenuation of the sweep stop adjusting means is set, for example, to ½, such a sweep voltage Vf as shown in FIG. 3E is obtained which starts the sweep with the voltage +E/3 and stops the sweep with the voltage +E/2.

As will be appreciated from the above, by changing the attenuation of the sweep stop adjusting means 3, the sweep stop voltage can also be set to a desired value within the range of 0 to +E.

Therefore, by suitable settings of the attenuation of the adjusting means 3 and 4, the sweep start frequency $f_1$ and the sweep stop frequency $f_2$ of the VCO 7 can be set to desired values within the sweep range of the VCO 7.

Next, a description will be given of the operation of the swept frequency signal generator. The operation starts with inputting the sweep start and stop frequencies $f_1$ and $f_2$ from the keyboard 13. The controller 2 sets digital values corresponding to the values of the sweep stop and start frequencies in the registers 3B and 4B of the sweep stop and start adjusting means 3 and 4, respectively. By this setting, approximate values of the sweep start and stop voltages are determined. The controller 2 is put in the initialization mode and controls the sweep output voltage of the sweep voltage generator 1 to hold it at the sweep start point. At the same time, the controller 2 sets in the register 12A a digital value corresponding to the aforesaid input sweep start frequency $f_1$, causing the reference signal generator 12 to produce a reference signal of the sweep start frequency $f_1$.

The VCO 7 is supplied with the sweep start voltage set by the sweep start means 4 and oscillates at a frequency corresponding to the voltage. The oscillation frequency of the VCO 7 is supplied to the frequency comparing means 11. The comparing means 11 compares the oscillation frequency of the VCO 7 with the frequency of the reference signal from the reference signal generator 12 and the comparison result is input into the controller 2. When the oscillation frequency of the VCO 7 is higher than the set frequency $f_1$, the controller 2 increases the attenuation of the sweep start adjusting means 4 to lower the oscillation frequency of the VCO 7. When the oscillation frequency of the VCO 7 is lower than the set frequency $f_1$, the controller 2 decreases the attenuation of the sweep start adjusting means 4 to raise the oscillation frequency of the VCO 7. When the oscillation frequency of the VCO 7 has been brought into agreement with the set frequency $f_1$, the controller 2 will shift to the next step.

In the next step the controller 2 causes the output voltage of the sweep voltage generator 1 to be swept and stops the sweep at the sweep stop value. At this time, the controller 2 sets in the register 12A a value corresponding to the sweep stop frequency $f_2$ entered from the keyboard 13, causing the reference signal generator 12 to provide a reference signal of the frequency $f_2$. On the basis of the output state of the comparing means 11 the controller 2 adjusts the set value of the sweep stop adjusting means 3 so that the oscillation frequency of the VCO 7 may become equal to the set sweep stop frequency $f_2$. By switching the controller 2 to the repetitive sweep mode after adjusting the sweep stop and start adjusting means 3 and 4 as described above, the VCO 7 repeatedly sweeps from the sweep start frequency $f_1$ to the sweep stop frequency $f_2$.

Figure 4:
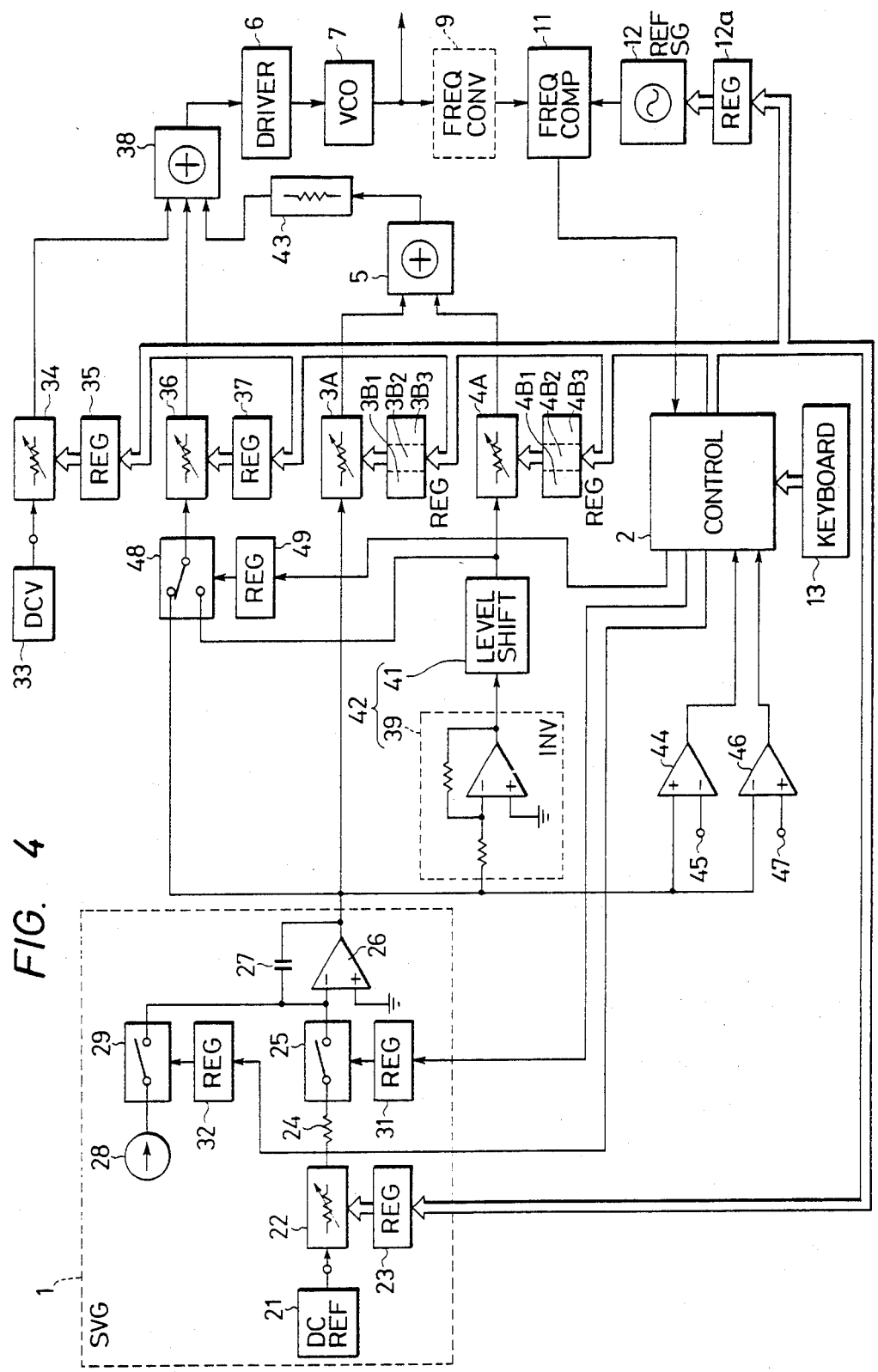
FIG. 4 is a block diagram illustrating another embodiment of the swept frequency signal generator of the present invention.

It is also possible to roughly set the sweep start and stop frequencies $f_1$ and $f_2$ first and then accurately set them through using the adjusting means 3 and 4. An example is shown in FIG. 4. In FIG. 4 the parts corresponding to those in FIG. 1 are identified by the same reference numerals and the sweep voltage generator 1 is formed by an integrator using an operational amplifier. A reference DC voltage from a DC reference voltage source 21 is applied to a variable attenuator 22 for setting the sweep time. The variable attenuator 22 is a kind of a digital-to-analog converter; for example, AD7542KN by Analog Device Inc. of United States can be employed. Supplied at its reference voltage terminal with an input analog voltage and at its digital input terminal with an input digital value to be converted, the variable attenuator 22 yields an analog output voltage proportional to the product of the input analog voltage and the input digital value. A value corresponding to the time for sweeping from the frequency $f_1$ to the frequency $f_2$ is set as the input digital value by the controller 2 in a register 23.

The output side of the variable attenuator 22 for the sweep time setting use is connected to the inverted input side of an operational amplifier 26 via an integrating resistor 24 and a switch 25. The non-inverted input side of the operational amplifier 26 is grounded and an integrating capacitor 27 is connected between the output side and the inverted input side of the operational amplifier 26. To the inverted input side is connected a constant current source 28 for discharging use via a switch 29. The switches 25 and 29 can be controlled by the controller 2 to be turned ON and OFF via registers 31 and 32, respectively. When only the switch 25 is in the ON state, the output voltage of the variable attenuator 22 is integrated with the time constant which is determined by the resistor 24 and the capacitor 27. When only the switch 29 is in the ON state, charges stored in the capacitor 27 are discharged. When the switches 25 and 29 are both in the OFF state, the charges stored in the capacitor 27 at that time are held unchanged.

The output side of a DC voltage source 33 is connected to a variable attenuator 34 for offset adjusting use. The attenuation of the variable attenuator 34 can be altered by a set value of a register 35, in which a reference point of the start of the sweep is set by the controller 2. The output side of the sweep voltage generator 1 is connected to a variable attenuator 36 for span adjusting use and the sweep frequency width is set in accordance with a value set in a register 37. The output sides of the variable attenuators 34 and 36 are connected to a summing circuit 38.

The output of the sweep voltage generator 1 sweeps, for example, from the voltage 0 to the voltage E and it is supplied to the variable attenuator 3A for sweep stop frequency adjusting use and, at the same time, it is polarity inverted by an inverter 39 into a sweep voltage which sweeps from the voltage 0 to the voltage $-E$. The polarity inverted output is provided to a level shift circuit 41, wherein it is converted into a voltage which sweeps from the voltage E to the voltage 0. That is to say, the inverter 39 and the level shift circuit 41 constitute sweep polarity inverting means 42. The output of the sweep polarity inverting means 42 is applied to the variable attenuator 4A for sweep start frequency adjusting use. For rough, medium and fine adjustments of the variable attenuators 3A and 4A, there are provided registers $3B_1$ and $4B_1$ for high-order bits, registers $3B_2$ and $4B_2$ for intermediate bits and registers $3B_3$ and $3B_4$ for low-order bits. The attenuators 34, 36, 3A and 4A can be formed by D/A converters as is the case with the variable attenuator 22. The outputs of the variable attenuators 3A and 4A are added together by the adder 5 and the added output is provided to an attenuator 43, wherein it is attenuated, for instance, down to about 1/100, thereafter being supplied to the summing circuit 38. The output of the summing circuit 38 is applied via the driver 6 to the VCO 7 to control it.

The output of the sweep voltage generator 1 is provided to the non-inverted input side of a comparator 44, which compares it with the sweep stop voltage E at a terminal 45 and produces a high-level output when the sweep voltage has exceeded the sweep stop voltage E. Furthermore, the output the sweep voltage generator 1 is provided to the inverted input side of a comparator 46, which compares it with the sweep start voltage 0 and yields a high-level output when the sweep voltage has become lower than the start voltage 0. Such output variations of the comparators 44 and 46 are provided as interrupts to the controller 2. The controller 2 is capable of individually setting data in the registers $3B_1$, $3B_2$, $3B_3$, $4B_1$, $4B_2$, $4B_3$, 12A, 23, 35 and 37 and switch control commands in the registers 31 and 32, too. The variable attenuator 36 for span adjusting use can be switched by a switch 48 between the output side of the sweep voltage generator 1 and the output side of the sweep polarity inverting means 42. The switch 48 is controlled by the controller 2 via a register 49.

Figure 5A:
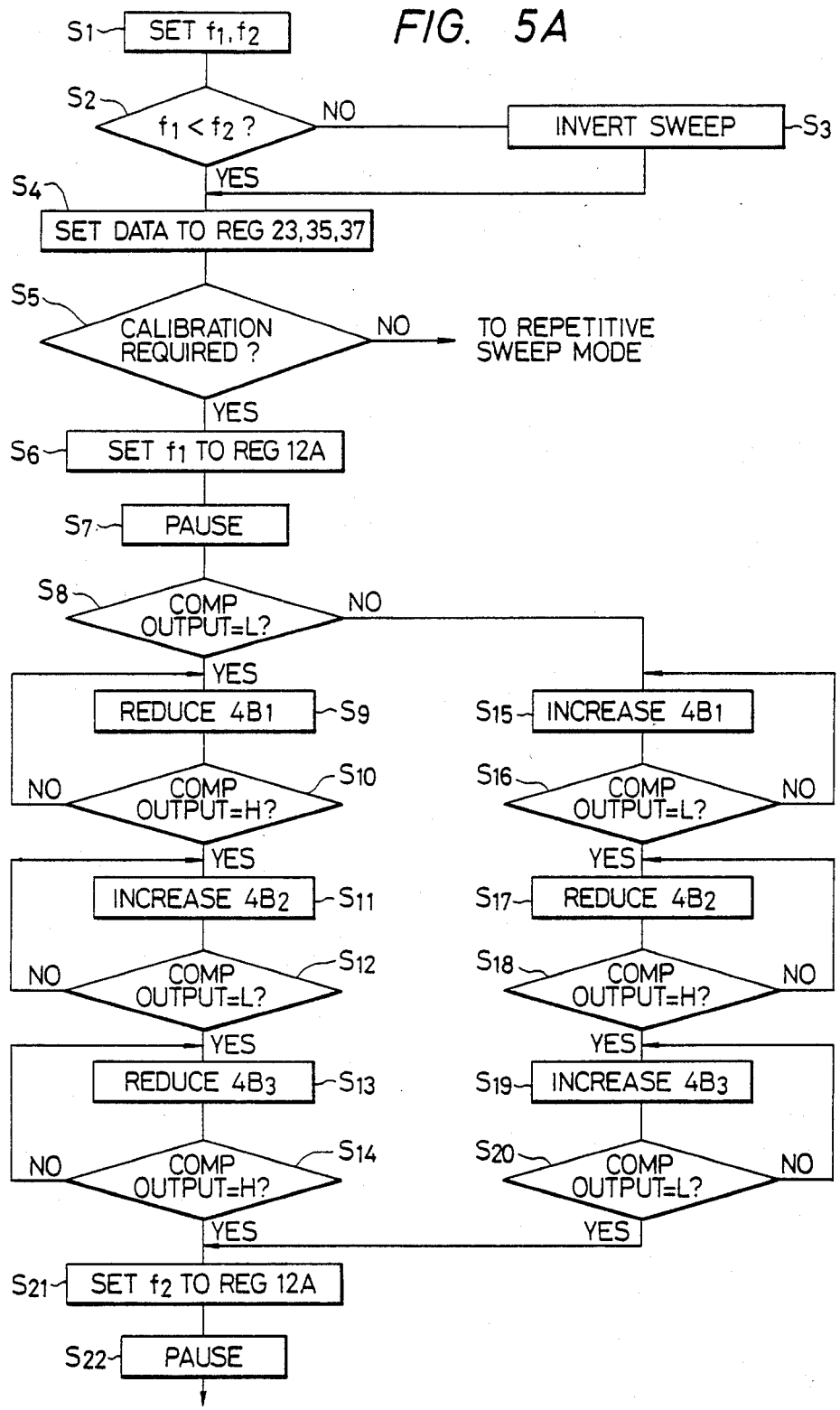
FIGS. 5A and 5B are a flowchart showing an example of the operation of the embodiment illustrated in FIG. 4.
Figure 5B:
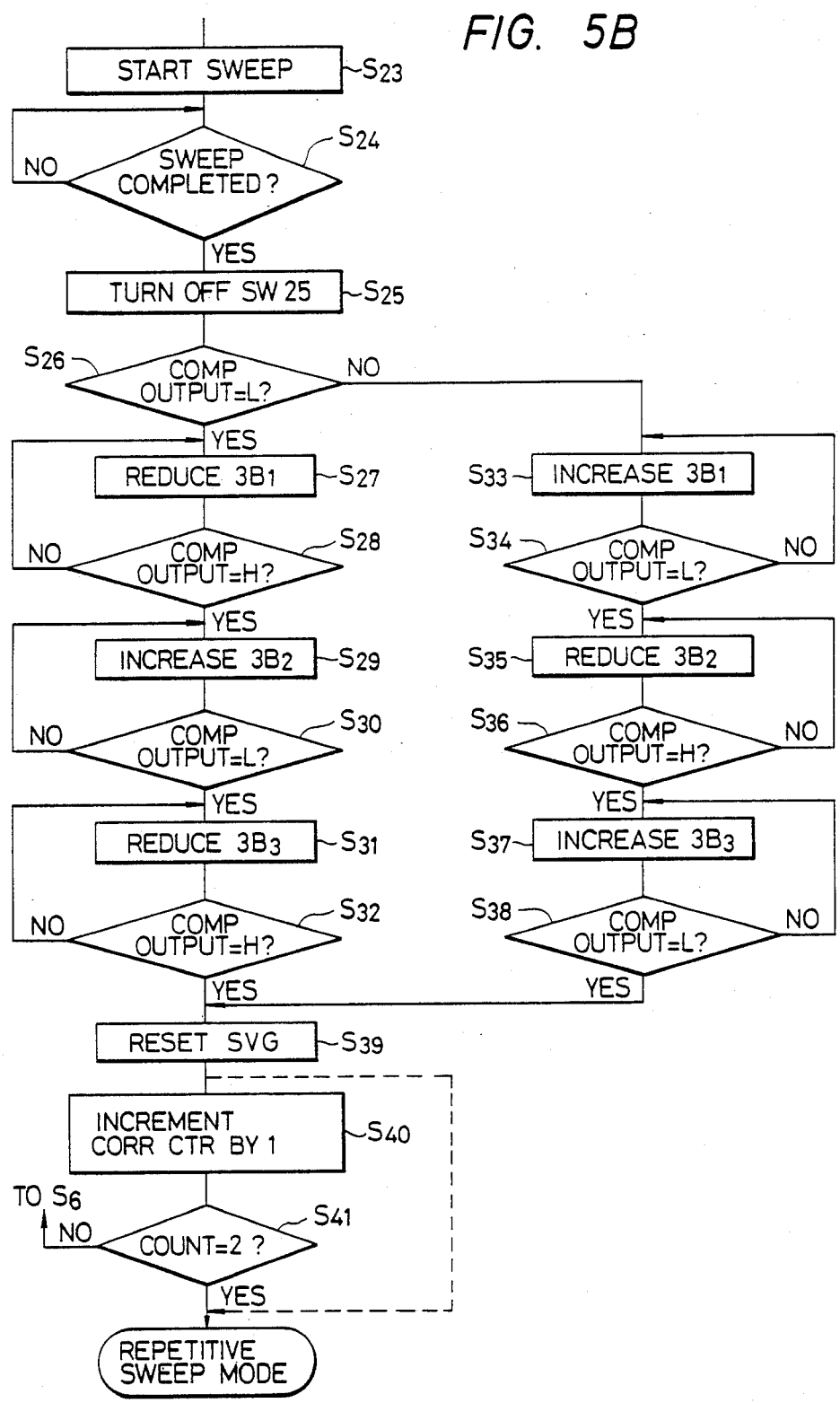
Figure 6:
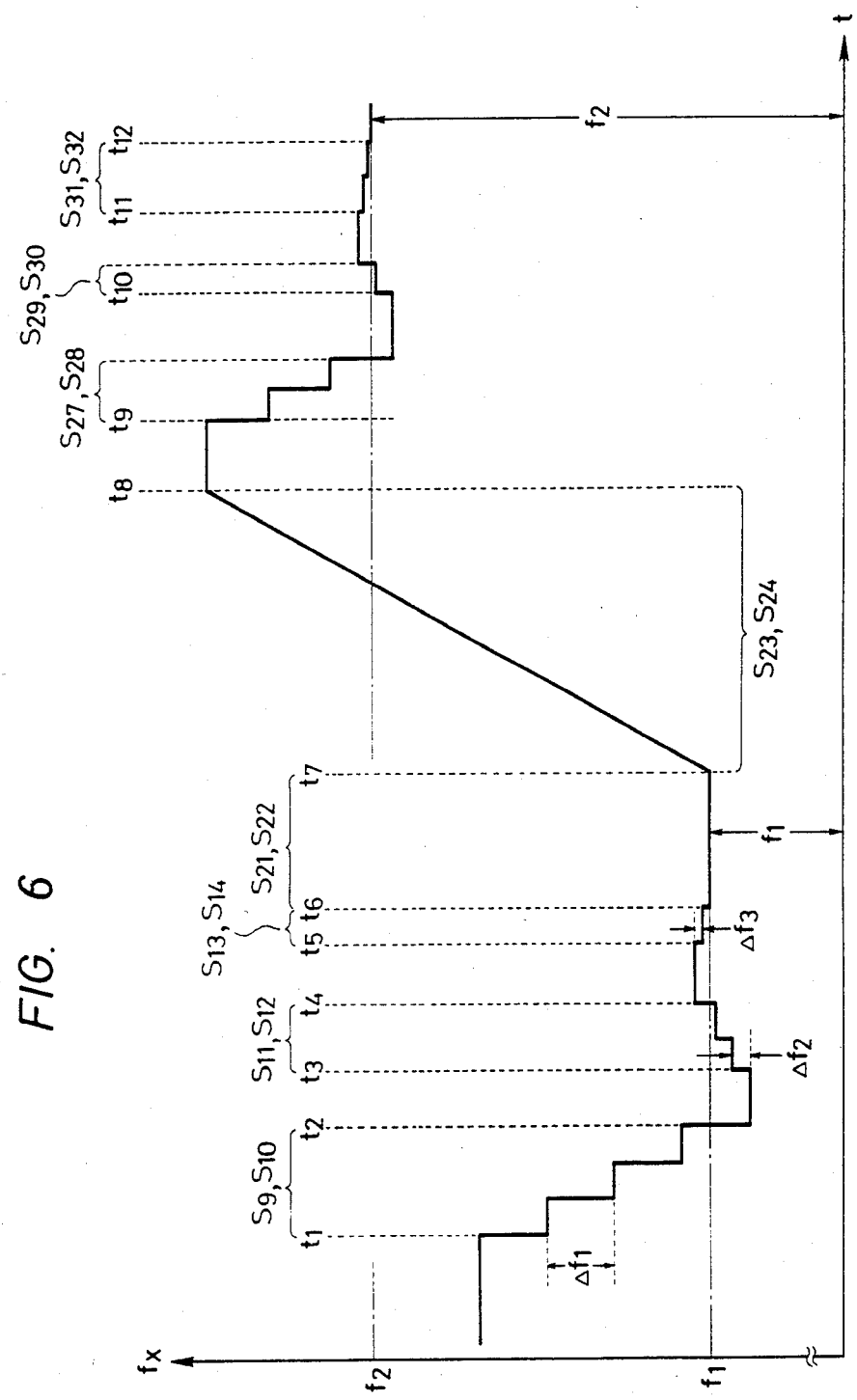
FIG. 6 is a diagram showing variations in the oscillation frequency of the VCO 7 based on the operation depicted in FIG. 5.

Next, a description will be given, with reference to the flowchart of FIGS. 5A and 5B, of the operation of the embodiment shown in FIG. 4. FIG. 6 shows variations in the control voltage for the VCO 7 and accordingly the oscillation frequency $f_x$ of the VCO 7 with time.

In step $S_1$ the sweep start and stop frequencies $f_1$ and $f_2$ are input into the controller 2 through the keyboard 13. In step $S_2$ the controller 2 checks whether the frequency $f_1$ is lower than the frequency $f_2$. When the frequency $f_1$ is lower than the frequency $f_2$, since the switch 48 is normally connected to the output side of the sweep voltage generator 1, the operation proceeds to step $S_4$. If the frequency $f_1$ is higher than the frequency $f_2$, the operation advances to step $S_3$, in which the controller 2 controls the switch 48 to connect it to the output side of the sweep polarity inverting means 42. Incidentally, the time for sweeping from the frequency $f_1$ to the frequency $f_2$ is also input into the controller 2 in advance and in step $S_4$ the controller 2 sets data corresponding to the input sweep time in the register 23, data corresponding to the input sweep start frequency $f_1$ in the register 35 and span data corresponding to the difference $f_1 - f_2$ in the register 37. Accordingly, the reference DC voltage corresponding to the set sweep time is integrated by the resistor 24, the operational amplifier 26 and the capacitor 27, and the integration start voltage (frequency) is determined by the output of the variable attenuator 34 for offset adjusting use and, further, the sweep frequency width is determined by the output of the variable attenuator 36. If no request is made for more accurate setting of the sweep start and stop frequencies $f_1$ and $f_2$ than those input from the keyboard 13 in advance, the controller 2 shifts to repetitive sweep mode under the conditions set so far.

If it is decided in step $S_5$ that an accurate calibration is requested, the operation proceeds to step $S_6$, in which data corresponding to the sweep start frequency $f_1$ is set in the register 12A, and after the lapse of time until the reference signal generator 12 becomes stable in step $S_7$ the operation shifts to step $S_8$. At this time, the switches 25 and 29 are held in the OFF state. When the output of the comparing means 11 is low level "L" in step $S_8$ it is decided that the oscillation frequency $f_x$ of the VCO 7 is higher than the set frequency $f_1$, and then, the operation proceeds to step $S_9$, in which the data set value of the register $4B_1$ is reduced by a constant value $\Delta f_1$, lowering the oscillation frequency $f_x$ of the VCO 7. In step $S_{10}$ it is checked whether the output of the comparing means 11 has become high-level "H" and, if not, the operation returns to step $S_9$, in which the set value of the register $4B_1$ is reduced again by the constant value $\Delta f_1$. Consequently, by the operations in step $S_9$, the oscillation frequency $f_x$ of the VCO 7 lowers by a step of $\Delta f_1$ from a time $t_1$ as shown in FIG. 6.

When it is decided in step $S_{10}$ that the output of the comparing means 11 has become high-level "H" at a time $t_2$, the operation proceeds to step $S_{11}$, in which the set value of the register $4B_2$ is increased to raise the oscillation frequency $f_x$ of the VCO 7 by a step of $\Delta f_2$ ($\Delta f_2 < \Delta f_1$) from a time $t_3$. Upon each increase of the oscillation frequency $f_x$ by $\Delta f_2$, it is checked in step $S_{12}$ whether the output of the comparing means 11 has become low-level "L". If it is decided in step $S_{12}$ that the output of the comparing means 11 has become low-level "L", the operation proceeds to step $S_{13}$ at that time $t_4$, in which the set value of the register $4B_3$ is reduced by a constant value, lowering the oscillation frequency $f_x$ of the VCO 7 from a time $t_5$ by a step of $\Delta f_3$ ($\Delta f_3 < \Delta f_2$). Upon each lowering of the oscillation frequency $f_x$ by $\Delta f_3$, it is checked in step $S_{14}$ whether the output of the comparing means 11 has become high-level "H". If it is decided in step $S_{14}$ that the output of the comparing means 11 has become high-level "H", the correction of the sweep start frequency $f_1$ ends at that time $t_6$ and the oscillation frequency $f_x$ of the VCO 7 agrees with the frequency $f_1$ with high accuracy and the data of the registers $4B_1$, $4B_2$ and $4B_3$ at that time are held unchanged.

When the output of the comparing means 11 is "H" in step $S_8$ it is decided that the oscillation frequency $f_x$ of the VCO 7 is lower than the set frequency $f_1$, and then, the operation proceeds to step $S_{15}$, in which the oscillation frequency $f_x$ of the VCO 7 is raised by a step of $\Delta f_1$. If the output of the comparing means 11 becomes low-level "L" in step $S_{17}$, the oscillation frequency $f_x$ of the VCO 7 is lowered by a step of $\Delta f_2$ in step $S_{17}$; when the output of the comparing means 11 becomes high-level "H" in step $S_{18}$, the oscillation frequency $f_x$ of the VCO 7 is raised by a step of $\Delta f_3$ in step $S_{19}$; and when the output of the comparing means 11 becomes low-level "L" in step $S_{20}$, it is recognized that the oscillation frequency $f_x$ of the VCO 7 has reached the set value $f_1$ with a high degree of accuracy at that time.

After the sweep start adjusting means 4 has thus been controlled to bring the oscillation frequency $f_x$ of the VCO 7 into agreement with the set input sweep start frequency $f_1$, the operation proceeds to step $S_{21}$, in which data corresponding to the input sweep stop frequency $f_2$ is set in the register 12A. After the lapse of time until the signal frequency of the reference signal generator 12 is stabilized to the frequency corresponding to the set data of the register 12A in step $S_{22}$, the switch 25 is turned ON in step $S_{23}$ to start the sweep of the sweep voltage generator 1. From this time $t_7$ the output voltage of the sweep voltage generator 1 linearly rises as shown in FIG. 6; that is, a sweep voltage is generated. In step $S_{24}$ it is checked whether the sweep voltage has reached the sweep stop voltage and it is detected at a time $t_8$ that the output of the comparator 44 has become high-level "H" and that the sweep voltage has reached the sweep stop voltage, the switch 25 is turned OFF in step $S_{25}$ to hold the sweep stop state and, after the lapse of time until the oscillating state of the VCO 7 is stabilized, the operation proceeds to step $S_{26}$.

In step $S_{26}$ it is checked from the output state of the comparing means 11 whether the oscillation frequency $f_x$ of the VCO 7 is higher than the set input sweep stop frequency $f_2$. In the case where the output of the comparing means 11 is low-level "L" and the sweep start frequency $f_1$ is lower than the sweep stop frequency $f_2$, the operation shifts to step $S_{27}$, in which the set value of the register $3B_1$ is reduced by a step of $\Delta f_1$, causing the oscillation frequency $f_x$ of the VCO 7 to lower from a time $t_9$. Upon each fall of the oscillation frequency $f_x$ by $\Delta f_1$, it is checked in step $S_{28}$ whether the output of the comparing means 11 has become high-level "H" and if so, the set value of the register $3B_2$ is increased in step $S_{29}$, raising the oscillation frequency $f_x$ of the VCO 7 by a step of $\Delta f_2$ from a time $t_{10}$. It is checked in step $S_{30}$ whether the output of the comparing means 11 has become low-level "L" and if so, the set value of the register $3B_3$ is decreased in step $S_{31}$, lowering the oscillation frequency $f_x$ of the VCO 7 by a step of $\Delta f_3$ from a time $t_{11}$. In step $S_{32}$ it is recognized that the oscillation frequency $f_x$ of the VCO 7 at a time $t_{12}$ when the output of the comparing means 11 has become high-level "H" has reached the sweep stop frequency $f_2$ with high accuracy.

In the case where it is decided in step $S_{26}$ that the oscillation frequency $f_x$ of the VCO 7 is lower than the sweep stop frequency $f_2$, the operation shifts to step $S_{33}$, in which the oscillation frequency $f_x$ of the VCO 7 is raised by a step of $\Delta f_1$. When it is decided in step $S_{34}$ that the output of the comparing means 11 is low-level "L", the operation proceeds to step $S_{35}$, in which the oscillation frequency $f_x$ of the VCO 7 is lowered by 66 $f_2$. When it is decided in step $S_{36}$ that the output of the comparing means 11 is high-level "H", the oscillation frequency $f_x$ of the VCO 7 is raised by $\Delta f_3$. When it is detected in step $S_{38}$ that the output of the comparing means 11 has become low-level "L", it is recognized that the oscillation frequency $f_x$ of the VCO 7 has been brought into agreement with the sweep stop frequency $f_2$ with a high degree of accuracy.

In the case where it is recognized in step $S_{32}$ or $S_{38}$ that the oscillation frequency $f_x$ of the VCO 7 has become equal to the sweep stop frequency $f_2$, the operation shifts to step $S_{39}$, in which the switch 29 is turned ON to reset the sweep voltage generator 1. When the oscillation frequency and the control voltage of the VCO 7 bear a linear relation, the operation shifts to the repetitive sweep mode as indicated by a broken line, repeating the sweep between the frequencies $f_1$ and $f_2$. In the event of having a hysteresis characteristic in the relation between the oscillation frequency and the control voltage of the VCO 7 as in the case of using a YIG as the VCO 7, it is desirable that the sweep start and stop adjusting means 4 and 3 for the frequencies $f_1$ and $f_2$ be adjusted a plurality of times. That is to say, in step $S_{40}$ a correction counter (provided in the controller 2) is incremented by 1 and in step $S_{41}$ it is checked whether the count value of the correction counter has reached a predetermined value, for instance, 2. If not, the operation returns to step $S_6$, repeating the above processing. When it is detected in step $S_{41}$ that the count value of the correction counter has reached the predetermined value, the operation shifts to the repetitive sweep mode. The decision in step $S_{41}$ may also be carried out between the steps $S_{14}$, $S_{20}$ and step $S_{21}$. Incidentally, in the repetitive sweep mode, the controller 2 turns ON the switch 25 to start the sweep and when the output of the comparator 44 becomes high-level, the controller 2 turns OFF the switch 25 but ON the switch 29 to stop the sweep and when the output of the comparator 46 becomes high-level, it turns ON the switch 25 and OFF the switch 29 to resume the sweep. according to said data input into the controller by said input The controller 2 repeats such operations.

Figure 7:
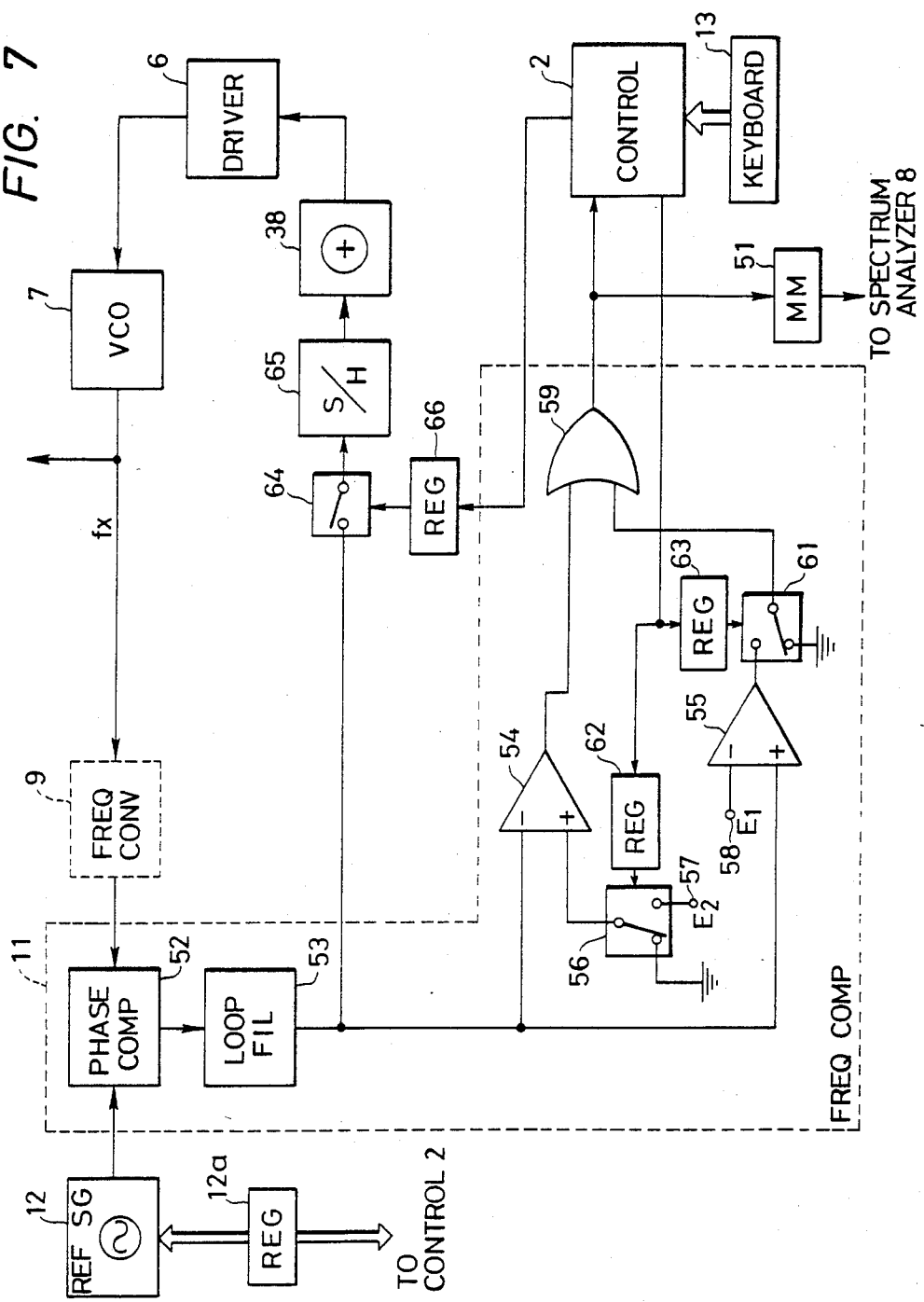
FIG. 7 is a block diagram illustrating a modified form of the swept frequency signal generator of the present invention.

In the repetitive sweep mode, the comparing means 11 can be utilized as follows: For example, as shown in FIG. 7, a marker frequency $f_m$ is input into the controller 2 from the keyboard 13 in advance, the marker frequency $f_m$ being an arbitrary frequency between the sweep start and stop frequencies $f_1$ and $f_2$ which is desired to provide a marker indication, and in the repetitive sweep mode the controller 12 sets in the register 12A data corresponding to the marker frequency. When the oscillation frequency $f_x$ of the VCO 7 has been brought into agreement with the marker frequency $f_m$ by the frequency sweep, the output of the comparing means 11 becomes low-level, for example, by which a marker generator 51 formed by a monostable multivibrator, is driven to produce marker pulses. The marker pulses are supplied, for instance, to the spectrum analyzer 8 in FIG. 1, indicating that the frequency being displayed at that time is the marker frequency $f_m$.

Also it is possible to temporarily stop the sweep at a preset frequency. For example, as shown in FIG. 7, a phase comparator 52, which is, for instance, MC4044 by Motorola of U.S.A., is used in the comparing means 11 and the phase compared output of the phase comparator 52 is provided to a loop filter 53, the output of which is applied to inverted and non-inverted input sides of comparators 54 and 55, respectively. The non-inverted input side of the comparator 54 is selectively connected by a switch 56 to ground and a power source terminal 57 of a voltage $E_2$. The inverted input side of the comparator 55 is connected to a power source terminal 58 of a voltage $E_1$. The output side of the comparator 55 is connected via an OR circuit 59 to the input side of the controller 2. The other input side of the OR circuit 59 is selectively connected by a switch 61 to the output side of the comparator 55 and ground. The switches 56 and 61 are controlled by setting data in registers 62 and 63 from the controller 2. Furthermore, the output side of the loop filter 53 is connected via a switch 64 to a sample hold circuit 65, the output side of which is in turn connected to the input side of the summing circuit 38. The ON-OFF control of the switch 64 is carried out by setting data in a register 66 from the controller 2. With the switch 64 in the ON state, a phase lock loop is closed via a route [VCO 7—phase comparator 52—loop filter 53—switch 64—sample hold circuit 65—summing circuit 38—driving circuit 6—VCO 7]. If this phase lock loop is in its locked state, the output voltage of the filter 53 lies between $E_1$ and $E_2$, and if the loop is unlocked, the output of the filter 53 falls outside of the range between $E_1$ and $E_2$. With the switch 56 connected to the terminal 57 and the switch 61 connected to the comparator 55, the comparators 54 and 55 and the OR circuit 59 constitute a window comparator. When the switch 64 is turned ON, the switches 56 and 61 are connected to the terminal 57 and the comparator 55, respectively. When the switch 64 is turned off as in the illustrated state, the switches 56 and 61 are grounded and, in this case, the output of the filter 53 is compared by the comparator 54 with ground potential. This latter state of the switches is provided during the adjustment operation described previously in connection with FIGS. 5A and 5B.

A frequency $f_l$ between the sweep start and stop frequencies $f_1$ and $f_2$ is input into the controller 2 from the keyboard 13 and data corresponding to the frequency $f_l$ is set in the register 12A. When the oscillation frequency $f_x$ of the VCO 7 has reached the frequency $f_l$, the controller 2 connects the switches 56 and 61 to the power source terminal 57 and the comparator 55, respectively, and turns ON the switch 64 and, at the same time, turns OFF the switch 25 in FIG. 4, stopping the sweep. As a result of this, the aforesaid phase lock loop is established to hold the oscillation frequency of the VCO 7 at the frequency $f_l$. In this case, when the phase lock loop is locked, the controller 2 detects it from the output of the OR circuit 59 and, after holding this state for a fixed period of time, turns OFF the switch 64 to hold the output of the loop filter 53 at that time in the sample hold circuit 65. In the locked state of the phase lock loop, the oscillation frequency $f_x$ of the VCO 7 is retained at the value corresponding to the data set in the register 12A and, in this while, the frequency sweep, for example, in the spectrum analyzer 8 shown in FIG. 1, is stopped and the brightness on its screen increases, indicating the frequency at that position. Even if drifts take place in the course of the repetition of the sweep, the drifts are corrected by the abovesaid locking operation. When the switch 64 is turned OFF, the switch 25 in FIG. 4 is turned ON to resume the frequency sweep.

It is also possible to employ such an arrangement in which the comparator 55 and the OR circuit 59 in FIG. 7 are omitted, the non-inverted input side of the comparator 54 is always grounded and when the oscillation frequency $f_x$ of the VCO 7 has reached the lock frequency set in the register 12A, the switch 64 is held in the ON state for a certain period of time (the time necessary for ensuring that the phase lock loop assumes the locked state) and then it is turned OFF to resume the sweep. Also it is possible in FIG. 4 to omit the resetting current source 28, to connect a reset switch in parallel to the integrating capacitor 27 and to omit the sweep start voltage detecting comparator 46. The embodiments of FIGS. 1, 4 and 7 are adapted so that the swept frequency to be actually used, which is the output of the VCO 7, may cover an appreciably wide frequency range. In practice, however, since the frequency range in which the frequency comparator 11 operates correctly is narrow (as compared with the sweep frequency range) and fixed, frequency converting means 9 is provided as indicated by the broken line block, by which the output frequency $f_x$ of the VCO 7 is so converted as to fall within the operating frequency range of the frequency comparator 11. In this frequency conversion, when the sweep range for the output of the VCO 7 is higher than the operating frequency range of the frequency comparator 11, the output frequency of the VCO 7 is lowered in a predetermined ratio or by a predetermined value and, in the opposite case, the output frequency of the VCO 7 is raised in a predetermined ratio or by a predetermined value. As the frequency converting means for such an operation, a frequency multiplier or divider can be used for increasing and decreasing the output frequency of the VCO 7 in a constant ratio and, in the case of increasing and decreasing the output frequency by a fixed value, a frequency mixer can be employed. In practice, the frequency multiplier, divider and mixer are respectively provided in the frequency converting means 9 and used selectively as required. Accordingly, the reference frequency to be generated by the reference signal generator 12 is set as a value into which the sweep start and stop frequencies $f_1$ and $f_2$ actually required are each frequency converted.

As has been described in the foregoing, according to the present invention, even if the VCO 7 has a hysteresis or nonlinear characteristic in its control voltage-oscillation frequency characteristic, it is possible to obtain a frequency sweep signal which accurately sweeps between set sweep start and stop frequencies.

It will be apparent that many modifications and variations may be effected without departing from the scope of the novel concepts of the present invention.

What is claimed is:

1. A swept frequency signal generator comprising:
   a sweep voltage generator for generating a sweep voltage;
   sweep stop adjusting means connected to the sweep voltage generator, for adjusting the amplitude of said sweep voltage to a first selected set value corresponding to the stop frequency of said sweep;
   sweep polarity inverting means connected to the sweep voltage generator, for inverting the sweep direction of said sweep voltage;
   sweep start adjusting means connected to the sweep polarity inverting means, for adjusting the amplitude of the inverted sweep voltage to a second selected set value corresponding to the start frequency of said sweep;
   a first summing circuit connected to the sweep start and stop adjusting means, for summing the adjusted sweep voltages;
   a voltage controlled oscillator connected to the first summing circuit and controlled in oscillation frequency by the output of the summing circuit to provide a frequency sweep;
   a reference signal generator for producing a reference signal with a selected reference frequency;
   comparing means coupled with the reference signal generator and the voltage controlled oscillator, for comparing the frequencies of the reference signal and the output of the voltage controlled oscillator;
   a controller including
       means for selectively setting said first and second set values of the sweep start and stop frequencies into the reference signal generator,
       means for changing the respective first and second set values set in the sweep start and stop adjusting means to cause each respective frequency of the reference signal to agree with the respective output of the voltage controlled oscillator according to the output of said comparing means,
       means for setting the sweep voltage generator in any mode of operation selected from a sweep start state, a reset state, a sweep stop holding state and a repetitive sweep mode state,
       means for checking the output state of the comparing means,
       means for controlling the setting of the sweep start adjusting means in accordance with the output state of the comparing means for bringing the oscillation frequency of the voltage controlled oscillator into agreement with the sweep start frequency, and
       means for controlling the setting of the sweep stop adjusting means to bring the oscillation frequency of the voltage controlled oscillator into agreement with the sweep stop frequency; and
   input means for setting and inputting data for said frequencies and modes of operation into the controller.

2. A swept frequency signal generator according to claim 1, which includes:
   span adjusting means connected to the sweep voltage generator, for providing with a selected gain an output corresponding to said sweep voltage;
   a reference DC voltage source for producing a reference DC voltage, and offset adjusting means connected to the reference DC voltage source, for adjusting its output reference DC voltage to a set value;
   an attentuator connected to the output side of the first summing circuit, for attenuating its summed output;

a second summing circuit connected to receive the outputs of the span adjusting means, the offset adjusting means and the attenuator, for outputting the sum thereof as a control signal to the voltage controlled oscillator;

means for setting in the span adjusting means a selected value for varying the width of said frequency sweep according to said data input into the controller by said input means; and means for setting in the offset means a selected value for varying the frequency at which said frequency sweep starts.

3. A swept frequency signal generator according to claim 1, wherein the sweep start and stop adjusting means are each a digital-to-analog converter having a reference voltage terminal to which is input the output voltage of the sweep voltage generator and an input digital terminal to which is input the respective one of said first and second set values and the respective adjusted values from the controller, and which produces an analog output proportional to the product of the two inputs thereto.

4. A swept frequency signal generator according to claim 2, wherein the span adjusting means and the offset adjusting means are each a digital-to-analog converter having a reference voltage terminal, to which is respectively input (1) the output of a selected one of the sweep voltage generator and the sweep polarity inverting means, and (2) the reference DC voltage source, and an input digital terminal, to which is respectively input each respective set value from the controller, and each of which produces a respective analog output proportional to the product of the two respective inputs thereto.

5. A swept frequency signal generator according to claim 2, comprising:

the sweep voltage generator being an integrating circuit including an integrating resistor, an integrating capacitor and an operational amplifier having a first input connected to one terminal of said integrating capacitor, wherein a first switch is inserted between the integrating resistor and said first input terminal of said operational amplifier;

resetting means for resetting the integrating capacitor; and sweep stop detecting means connected to the output of the sweep voltage generator, for detecting that said sweep voltage reaches a set sweep stop frequency, wherein the controller holds said first switch in the OFF state during adjustment of the sweep start adjusting means, after resetting the integrating capacitor by the resetting means, during adjustment of the sweep stop adjusting means, and when the sweep stop is detected by the sweep stop detecting means.

6. A swept frequency signal generator according to claim 5, wherein the resetting means is a constant-current source connected via a second switch to the integrating capacitor, and wherein sweep start detecting means is provided for detecting that the output voltage of the sweep voltage generator has reached a sweep start voltage by the resetting operation.

7. A swept frequency signal generator according to claim 1, wherein the means for bringing the oscillation frequency of the voltage controlled oscillator into agreement with an input sweep start or stop frequency is means responsive to the output of the comparing means to repeat a plurality of times an operation by which the respective one of said set values in the corresponding adjusting means is changed by steps of a first fixed value, so that the oscillation frequency of the voltage controlled oscillator may approach a set frequency, and by which, when the output state of the comparing means is inverted, the set value for the corresponding adjusting means is changed in the opposite direction by steps of a second fixed value that is smaller than said first fixed value.

8. A swept frequency signal generator according to claim 5, wherein sweep time adjusting means is provided between an input DC power source and the first switch, and wherein a value corresponding to a sweep time input by the controller is set in the sweep time adjusting means and a voltage of a magnitude corresponding to the set value is provided to the integrating circuit.

9. A swept frequency signal generator according to claim 2, comprising a marker generator connected to the comparing means, for generating a frequency marker, when the controller has set a value corresponding to a respective marker frequency into the reference signal generator and when agreement of the oscillation frequency of the voltage controlled oscillator with the marker frequency is detected from the output of the comparing means.

10. A swept frequency signal generator according to claim 2 or 9, comprising a loop filter connected to receive the output of said comparing means, a sample hold circuit connected via a third switch to the output of said loop filter and supplying its output to the second summing circuit, and said controller including means for setting a value corresponding to an input lock frequency in the reference signal generator, means for turning ON the third switch and stopping the frequency sweep upon detection of the agreement of the oscillation frequency of the voltage controlled oscillator with the lock frequency from the output of the comparing means, and means for turning OFF the third switch and resuming the frequency sweep, with th oscillation frequency of the voltage controlled oscillator locked to the lock frequency.

11. A swept frequency signal generator according to claim 1, wherein the controller includes means for activating a plurality of times the means for bringing the oscillation frequency of the voltage controlled oscillator into agreement with the sweep start and stop frequencies corresponding to said first and second set values set in said reference signal generator, whereby hysteresis in the setting of the start and stop frequencies for the sweep can be eliminated.

* * * * *